(12) United States Patent
Zheng et al.

(10) Patent No.: US 11,269,561 B2
(45) Date of Patent: *Mar. 8, 2022

(54) SPECULATIVE BANK ACTIVATE DYNAMIC RANDOM ACCESS MEMORY (DRAM) SCHEDULER

(71) Applicant: International Business Machines Corporation, Armonk, NY (US)

(72) Inventors: Jie Zheng, Poughkeepsie, NY (US); Steven R. Carlough, Poughkeepsie, NY (US); William J. Starke, Round Rock, TX (US); Jeffrey A. Stuecheli, Austin, TX (US); Stephen J. Powell, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/129,248

(22) Filed: Dec. 21, 2020

(65) Prior Publication Data

US 2021/0109680 A1  Apr. 15, 2021

Related U.S. Application Data

(63) Continuation of application No. 16/532,041, filed on Aug. 5, 2019, now Pat. No. 11,042,325.

(51) Int. Cl.
*G06F 3/06* (2006.01)
*G06F 9/38* (2018.01)
*G06F 9/52* (2006.01)

(52) U.S. Cl.
CPC ............ *G06F 3/0659* (2013.01); *G06F 3/061* (2013.01); *G06F 3/0614* (2013.01);
(Continued)

(58) Field of Classification Search
CPC ...... G06F 3/0659; G06F 3/061; G06F 3/0611; G06F 3/0614; G06F 3/0673; G06F 9/3834; G06F 9/528; G06F 13/1668
See application file for complete search history.

(56) References Cited

U.S. PATENT DOCUMENTS 6,230,235 B1  5/2001 Lu et al.
6,347,354 B1  2/2002 Abhyankar et al.
(Continued)

FOREIGN PATENT DOCUMENTS

CN  101479807 A  7/2009
EP  1426866 A1  6/2004

OTHER PUBLICATIONS

Son, Y. H., Seongil, O., Ro, Y., Lee, J. W., & Ahn, J. H. (Jun. 2013). Reducing memory access latency with asymmetric DRAM bank organizations. In ACM SIGARCH Computer Architecture News (vol. 41, No. 3, pp. 380-391). ACM.
(Continued)

*Primary Examiner* — Charles Rones
*Assistant Examiner* — Hewy H Li
(74) *Attorney, Agent, or Firm* — Patterson + Sheridan, LLP

(57) ABSTRACT

A system and associated processes may perform a memory access operation that includes receiving a data packet comprising a command of a type of a plurality of types of commands. The processes may include initiating a decoding of a first portion of the command, and automatically speculating as to the type of the command. Based on the speculation as to the type of the command, a bank activate command may be generated before the data packet is entirely decoded or received.

20 Claims, 5 Drawing Sheets

(52) U.S. Cl.
CPC .......... *G06F 3/0673* (2013.01); *G06F 9/3834* (2013.01); *G06F 9/528* (2013.01)

(56) References Cited

U.S. PATENT DOCUMENTS

| | | | |
|---|---|---|---|
| 6,381,672 | B1 | 4/2002 | Strongin et al. |
| 6,389,514 | B1 | 5/2002 | Rokicki |
| 7,130,967 | B2 | 10/2006 | Arimilli et al. |
| 8,230,157 | B2 | 7/2012 | Kim et al. |
| 9,582,204 | B2 | 2/2017 | Sarcone et al. |
| 9,823,964 | B2 | 11/2017 | Reed et al. |
| 2003/0159008 | A1 | 8/2003 | Sprangle et al. |
| 2004/0006665 | A1 | 1/2004 | Moss |
| 2006/0095646 | A1 | 5/2006 | Gower et al. |
| 2008/0005647 | A1* | 1/2008 | Bains .................. G06F 11/1004 714/781 |
| 2014/0115294 | A1 | 4/2014 | Fleischer et al. |
| 2014/0317361 | A1 | 10/2014 | Dally |
| 2019/0155516 | A1 | 5/2019 | Bhargava et al. |
| 2020/0285580 | A1 | 9/2020 | Subramanian et al. |

OTHER PUBLICATIONS

Kaseridis, D., Stuecheli, J., & John, L. K. (Dec. 2011). Minimalist open-page: A DRAM page-mode scheduling policy for the many-core era. In 2011 44th Annual IEEE/ACM International Symposium on Microarchitecture (MICRO) (pp. 24-35). IEEE.

IBM,"Method For Controlling Memory Power," IP.com No. IPCOM000186042D | IP.com Electronic Publication Date: Aug. 6, 2009 | 6 pages.

List of IBM Patents or Patent Applications Treated As Related, for U.S. Appl. No. 17/129,248 as filed on Dec. 21, 2020.

U.S. Appl. No. 16/532,041 Speculative Bank Activate Dynamic Random Access Memory (DRAM) Scheduler.

* cited by examiner

SPECULATIVE BANK ACTIVATE DYNAMIC RANDOM ACCESS MEMORY (DRAM) SCHEDULER

CROSS-REFERENCE TO RELATED APPLICATIONS

This application is a continuation of co-pending U.S. patent application Ser. No. 16/532,041, filed Aug. 5, 2019. The aforementioned related patent application is herein incorporated by reference in its entirety.

BACKGROUND

The present invention relates to computer memory, and more specifically, to memory access operations in a distributed memory subsystem, such as may interface with a dynamic random access memory (DRAM).

DRAM, including as double data rate 4 (DDR4) synchronous dynamic random access memory (SDRAM), is often used as primary processor memory in modern computers. During a memory access operation, a memory controller issues a bank activate command and a read command to perform a read operation and data retrieval from a DRAM. The bank activate command designates a row of the DRAM containing a line to be accessed, and the read command specifies a column to be accessed. Both the bank activate command and the read command are serial processes. As serial processes, scheduling of the bank activate and read commands affects how quickly data can be returned to a host that requested the stored data.

The memory controller in a distributed memory subsystem is conventionally located on a separate microchip than core compute blocks of a processor. A memory request may be transmitted over a number of cycles on a narrow, high-speed channel. Cyclic redundancy check (CRC) processes are often applied over an entire data packet to ensure correctness. Translation and decoding of the entire packet, along with processing associated with the CRC, queuing, and other timing considerations require multiple processor cycles that can slow the memory access operation.

SUMMARY

According to one embodiment of the present invention, a method of performing a memory access operation includes receiving a data packet comprising a command of a type of a plurality of types of commands. The method may include initiating a decoding of a first portion of the command, and automatically speculating as to the type of the command. Based on the speculation as to the type of the command, the method may include generating a bank activate command before the data packet is entirely decoded.

According to another particular implementation, a system includes a decoder configured to receive a data packet comprising a command of a type of a plurality of types of commands and to initiate decoding of a first portion of the command, and a processor to automatically speculate as to the type of the command, and based on the speculation as to the type of the command, to initiate generation of a bank activate command before the data packet is entirely decoded.

According to another particular embodiment, a computer program product for performing a memory access operation includes a computer-readable storage medium having computer-readable program code embodied therewith, the computer-readable program code executable by one or more computer processors to receive a data packet comprising a command of a type of a plurality of types of commands, to initiate decoding of a first portion of the command, to automatically speculate as to the type of the command, and based on the speculation as to the type of the command, to generate a bank activate command before the data packet is entirely decoded.

DETAILED DESCRIPTION

Figure 1:
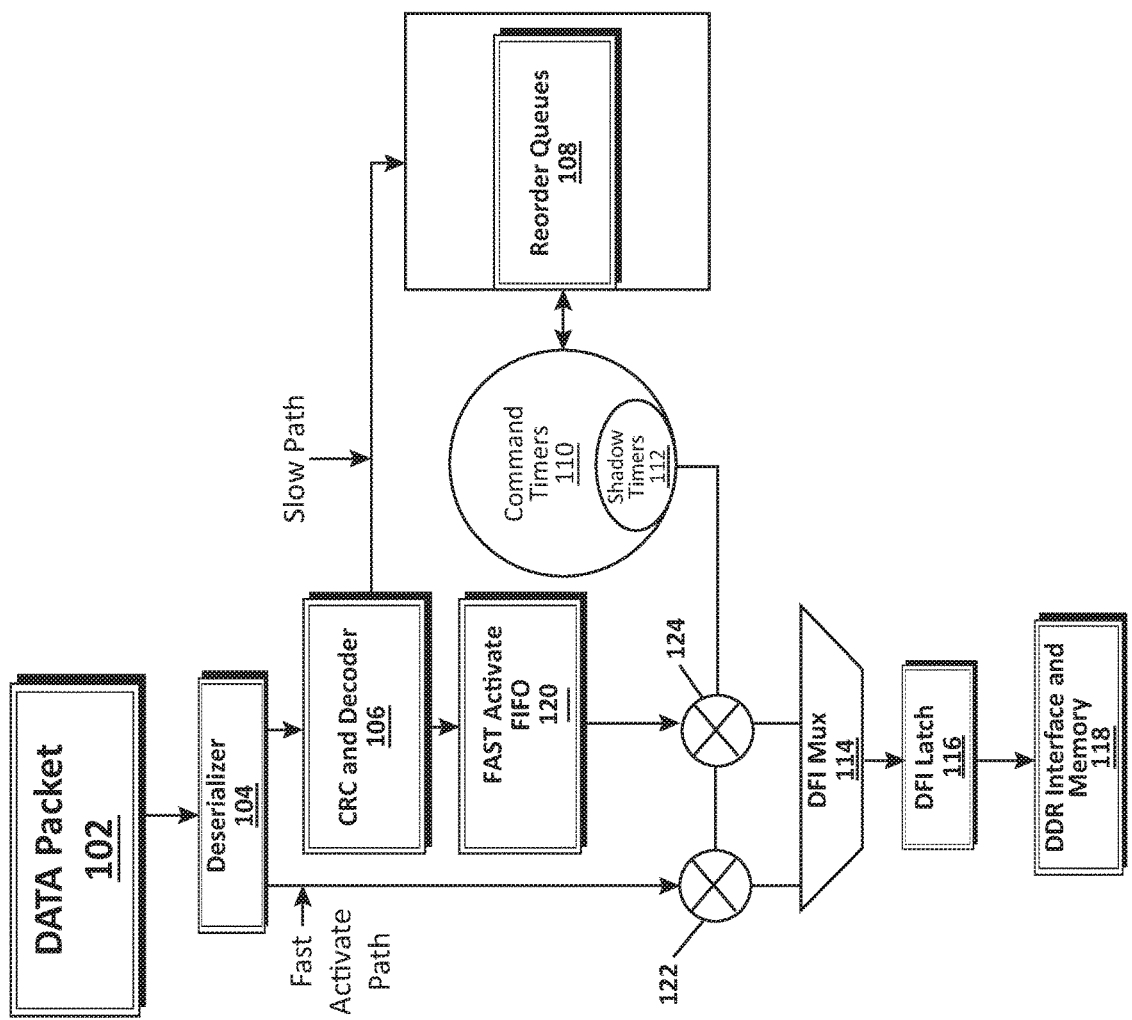
FIG. 1 is a block diagram of an embodiment of a distributed memory subsystem configured to perform a speculative bank activate command during a memory access operation.

According to a particular example of a memory request operation, a bank activate command is issued to a memory, immediately and speculatively, before an entire data packet has been fully received, fully decoded, or error checked. An implementation may have particular application within a distributed memory subsystem and with a data packet comprising multiple commands. The commands of the data packet may eventually be checked and collected in a mainline command queue, where non-speculative bank activate commands and read commands are issued. The speculative bank activate command may expedite the memory read access and data return, therefore reducing memory latency.

If no errors are present in a received command, the speculative bank activate command may reduce memory latency by expediting issuance of the memory read command. If errors are alternatively detected, the bank may be precharged with no read access being accomplished. Another, non-speculative, bank activate command may then be reissued from a slow queue once the packet data has been correctly received.

An embodiment of the system proceeds with issuing a speculative bank activate command based on a high probability that a read command has been detected from selected bits or is otherwise present. Should the system have made an incorrect assumption regarding the presence of the read command, the system may initiate the precharge operation. In one implementation, a speculative activate bank command may always be generated, and the system makes a later decision as to whether the speculative bank activate command is to be used and a read command issued.

According to a particular embodiment, a direct bypass path from an input command parser to a DRAM scheduler may allow for a fast, speculative bank activate command to be issued to the memory. Should the scheduler recognize that the bank is idle and no older, or preferred work is waiting in queues, the bank activate command may be issued. The bank activate command can alternatively be deferred into a fast activate FIFO for near-term use or dropped all-together. Eventually, the new command will be CRC checked and pushed into a mainline command first in, first out (FIFO) queue for later issue.

Regardless of whether a speculative bank activate command is issued, a read command may be issued only once the CRC-checked command reaches the main command queue. If no speculative bank activate command was issued, or if the bank activate command is sent to an incorrect address, the read operation still requires a bank activate before the read command may be sent.

Once a bank activate command (speculative or non-speculative) is issued, a bank timer may be started. The bank timer may be independent of the memory access. The bank timer may control when operations may be issued to that bank. When the command reaches the main command queue, and the bank timer determines that a timing parameter, time row to column delay (tRCD), has been met, the read may be issued. The read part of the command may not need to be expedited since it must be spaced relative to the bank activate command. The bank timer may issue a precharge to the bank once another timing parameter, minimum ACT to PRE timing (tRAS) has been met and no work is outstanding to the page. The tRAS timing parameter may indicate a minimum time until the system may wait after an activate until it may precharge. If a CRC error was detected (e.g., causing the wrong bank or row to be speculatively activated), the precharge may be issued without any read to the memory.

The timing parameter, tRCD, may comprise an amount of time the system waits from when a bank activate command is issued to when a read command may be generated and sent. As such, the system effectively has that much time to determine whether prediction was incorrect and a condition is not right for the bank activate command. For example, an error could be present, or the command could be improperly addressed. In such an instance, the precharge operation may be commenced to unwind the initiated memory access operation.

An embodiment of a DRAM distributed memory system utilizes a fast path and speculative bank activate command in manner that bypasses correction and timer schemes. The system may thus facilitate a speedier memory access operation while still ensuring accuracy of the memory access. Put another way, performance of the speculative bank activate command may be directed to getting read data back to a processor as quickly as possible.

An embodiment of the system includes a packetized memory interface that includes a deserializer. In an example, a new memory read command may be received by the packetized memory interface. The packet data may be deserialized, or widened, to identify an embedded packetized command. For instance, a read command may be positioned on a first beat of the received data packet. Positioning the read command near or at the front of the packetized command may allow an opcode decode of the packetized memory interface to quickly identify the command before the entire packet may be decoded or checked. Bits comprising a command may also be assumed based on known packet templates. As explained herein, the early identification of the packetized command may expedite an initiation of the speculative bank activate command.

The packetized memory interface may additionally include encoding used to speculate on a type of command seen in the packet. The system may have to perform a CRC check to know with certainty that a packet is received without errors and may require a complete command decode to determine if a command from the data packet is actually a read command. However, an embodiment of the system may speculate as to the type of command. In one instance, packetized memory interface may use information relating to an assumed packet template to know which bits to focus on for purposes of speculation regarding the read command. Again, the system may not be able to confirm the accuracy of the speculated command type (or template type) for several cycles. The speculation may include multiple levels of speculation. In another example, the system may recognize that a command is addressed to a specific address likely to be associated with a read operation. This speculation may allow the system to decode the likely read command and to send out the bank activate command on the DRAM interface in a single cycle. In still another embodiment, the system may be programmed to speculate that one or all commands positioned near the front of the data packet are read commands.

The bank activate command may be initiated on a fast path, or sidecar-analogous mechanism, before the entire packet is translated and decoded. A typical data packet may include four or more commands. Moreover, the bank activate command may be generated and sent also before CRC checking and DRAM reorder queuing occurs. That is, the speculative bank activate command may be initiated without checking for errors. The system may avoid cycles used to translate and decode all of the commands in the data packet, as well as cycles expended and associated time delays attributable to CRC checking and reorder scheduling. The high speed fast path may receive the data packet and generate the speculative bank activate command in a single cycle though a microchip.

As explained herein, the bank activate command may be configured to pull in the row of a memory array, and the read command may be configured to burst out the column of the data to be read. The read command may not be issued until about twenty cycles, in one implementation, after the bank activate. By anticipating and preemptively using a fast activate command, the row information may be pulled in as soon as possible and is ready whenever the read command is sent. When an error is present in the command, the bank activate command may still have been issued. In such a scenario, the system may pre-charge the memory bank.

Command timers and shadow timers may be used to manage timing considerations pertaining to commands and resources. For instance, the shadow timers may include a reduced set of command timers, such as stat bits, that indicate which ranks, banks, or group of banks may already be activated. The shadow timers may store state information associated with a resource. For instance, the command timers may report that a particular bank is already activated, or in another example, that a bank within a block of banks is activated. This expedites the speculative activate while ensuring an activate is not issued to a bank that is already activated.

An embodiment of the system may bypass the CRC and associated cycles used for checking. The system may further bypass the DRAM reorder queues. The DRAM reorder queues may be used as a sort of warehouse for commands, to order and schedule commands in an efficient order. For example, a command may be queued and made to wait for a bank that is already in use. Another command may proceed immediately as it is requesting an idle bank. Another command may go directly to an idle resource. The queues on the microchip may service hundreds of commands concurrently.

A DDR physical (PHY) interface (DFI) multiplexor may be used to select a path to send to the DRAM via the DFI latch and DDR interface. Comparison modules may compare which resources a bank activate command is going to and whether the resource is free. The resource availability information may be determined from the timer module to conditionally send the activation command down the fast path. A slow path may be executed concurrently and may takes ten or more cycles to get commands from the data packet into the DRAM reorder queues.

An embodiment of the fast path may include an intermediate portion that is not a full speculation, but that uses an intermediate tier to decode, activate, and place into the FIFO queue. The FIFO queue may be a reduced structure that may be used at the comparison modules to compare against a reduced set of resources and that may be selected by the DFI multiplexer. The intermediate portion may look at multiple commands from the packet, but still not all of the commands embedded in the data packet.

In a non-speculative bank activate command operation, a data packet may arrive via a high speed serial physical interface (HSS PHY) in communication with a host. The deserializer may take a number of cycles to receive the beat data via a serial bus. CRC operations may be performed to check for errors. That is, the CRC may verify that a read command is to be performed and may check the overall accuracy of the data. Should an error be found, the data may be discarded and made to be retransmitted.

Translation and decoding operations may be performed on the received data packet. A determination may be made as to what type of command(s) are included in the data packet.

A relatively slower path of an embodiment of the system may send retrieved commands to a DRAM reorder queue. While commands are queued, the system may access timers to see if a needed resource is available. For instance, the system may determine that a resource is idle. If so, the system may issue a bank activate command via the DFI multiplexer and latch to the DDR interface. The bank activate command may pull in the row to be accessed. For a read command to be issued, the system may wait for the timing parameter, time row to column delay (tRCD).

A read command may also be queued in the DRAM reorder queue. Once the tRCD parameter is met, the read command may be sent down the same path, but may actually go to memory to retrieve the data from memory. That is, the read command may initiate a retrieval of requested data to the host from the memory via the DDR interface.

After the read operation has retrieved the data, the system may wait for another timing parameter, tRAS, corresponding to when a charge may be restored to the memory device. The tRAS timing parameter may indicate a minimum time until the system may wait after an activate until it may precharge. Once the timer indicates that tRAS has expired, the memory banks may be eligible for a precharge command to be issued.

A relatively faster path of an embodiment of the system may concurrently use a fast activate path in parallel to receive the package data (e.g., data beat). The system may not wait for the entire data packet to be received or decoded, as with the slower path. Instead, the system may issue a bank activate command, speculatively.

An intermediary process of a particular embodiment may determine if a speculative bank activate command is appropriate. For example, the determination may be based on whether certain bits of the packet suggest a read command is present, or if a resource is idle. For instance, a bank activate command may not be issued if a bank is busy with another access. In other example, the bank activate command may not be issued speculatively when the system is currently performing writes (i.e., not reads), or the device is not powered up. Other considerations may include disabled bits, or the device is undergoing a refresh, a throttling, or a calibration.

By not waiting for entire data packet to be received, time delays associated with waiting for the timing parameter tRCD in conventional serial processing may be reduced. An illustrative tRCD may still be twenty cycles after the bank activate command is speculatively issued. But by the time the read command is queued, tRCD will have counted down. Starting the tRCD timer earlier may reduce latency because the system would otherwise have had to wait for the entire tRCD to expire before the read command may be issued. That is, issuing the bank activate command speculatively may start the tRCD timer earlier to reduce waiting once the read command is ready.

The speculative bank activate command does not cause an actual memory retrieval without a read command also being issued. Where no read command is ultimately issued, the speculative bank activate command is effectively ignored and a precharge operation may be initiated. That is, a precharge operation may restore charges in the memory device.

The speculative bank activate command may be an optional process. Speculative bank activate command processes may be dynamically disabled in response to error rates, overall throughput, and in response to power considerations, among other factors.

Now turning more particularly to the drawings, FIG. 1 is a block diagram of an embodiment of a distributed memory subsystem or system 100 configured to perform a speculative bank activate command during a memory access operation. The system 100 may comprise a microchip and a memory controller.

The system 100 illustrates a data packet 102 that may be received by a deserializer 104. The data packet 102 may include multiple commands, such as a read command. The data packet 102 may arrive via a HSS PHY microchip in communication with a host (not shown). The deserializer 104 may take a number of cycles to receive the beat data via a serial bus.

The system 100 may include a CRC and decoding module 106 to check for error and decode the arriving data. The CRC function of the module 106 may verify that a read command is to be performed and may check the overall accuracy of the data. Should an error be found, the data may be discarded and made to be retransmitted. The translation and decoding operations of the module 106 may be performed on the received data packet 102. A determination may be made as to what type of command(s) are included in the data packet 102.

A relatively slower path of the system 100 may send retrieved commands to a DRAM reorder queue 108. While commands are queued, the system 100 may access timers 110, 112 to see if a needed resource is available. For instance, the system 100 may determine that a resource is idle. If so, the system 100 may issue a bank activate command via a DFI multiplexer 114 and latch 116 to a DDR interface 118. The bank activate command may pull in the row to be accessed. For a read command to be issued, the system may wait for the timing parameter, time row to column delay (tRCD) from a timer module 110.

A read command may also be queued in the DRAM reorder queue 108. Once the tRCD parameter is met, the read command may be sent down the same path, but may actually go to memory to retrieve the data from memory via the DDR interface 118.

A relatively faster path of an embodiment of the system 100 may concurrently use a fast activate path in parallel to receive the package data 102. The system 100 may not wait for the entire data packet 102 to be received or decoded, as with the slower path. Instead, the system 100 may issue a bank activate command, speculatively.

An embodiment of the fast path may include an intermediate portion that is not a full speculation, but that uses an intermediate tier to decode, activate, and place into the FIFO queue 120. The FIFO queue 120 may be a reduced structure that may be used at the comparison modules to compare against a reduced set of resources and that may be selected by the DFI multiplexer 114. The intermediate portion may look at multiple commands from the data packet 102, but still not all of the commands embedded in the data packet.

The DFI multiplexor 114 may be used to select a path to send to the DRAM via the DFI latch 116 and DDR interface 118. Comparison modules 122, 124 may compare which resources a bank activate command is going to and whether the resource is free. The resource availability information may be determined from the timer module 110 to conditionally send the activation command down the fast path. A slow path may be executed concurrently and may takes ten or more cycles to get commands from the data packet into the DRAM reorder queues. Each of the modules and components shown in FIG. 1 may include a processor and be combined with others to perform substantially similar functions.

Figure 2:
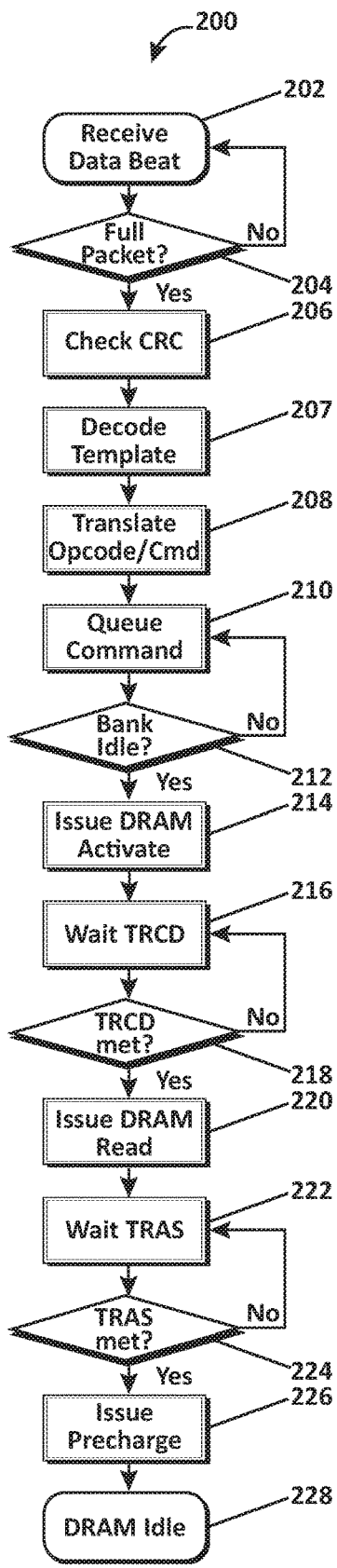
FIG. 2 is a flowchart of an embodiment of a method that may be performed by the system of FIG. 1 to execute a non-speculative memory access operation.

FIG. 2 is a flowchart of an embodiment of a method 200 that may be performed by the system of FIG. 1 to execute a non-speculative memory access operation. At 202, the system may receive a data beat, such as the data packet 102 of FIG. 1. The system may determine at 204 if the full packet has been received and deserialized. If not, the method 200 may continue to deserialize and receive the data pack. For instance, an embodiment may use the deserializer 104 of FIG. 1 to continue to receive the entire data packet.

After the entire data packet is received at 204, the system may perform CRC operations at 206. At 207, the packet is decoded among different templates or containers. Translation and opcode processes may be performed at 208 on the error checked data.

Error checked and translated commands may be queued at 210. Should a memory bank be determined to be idle at 212, the system may issue a DRAM activate command at 214. The system may then wait out tRCD at 216 and 218, and eventually issue a DRAM read command at 220. The system may wait for tRAS to be met at 222 and 224 before issuing a precharge at 226 to achieve DRAM idle at 228.

Figure 3:
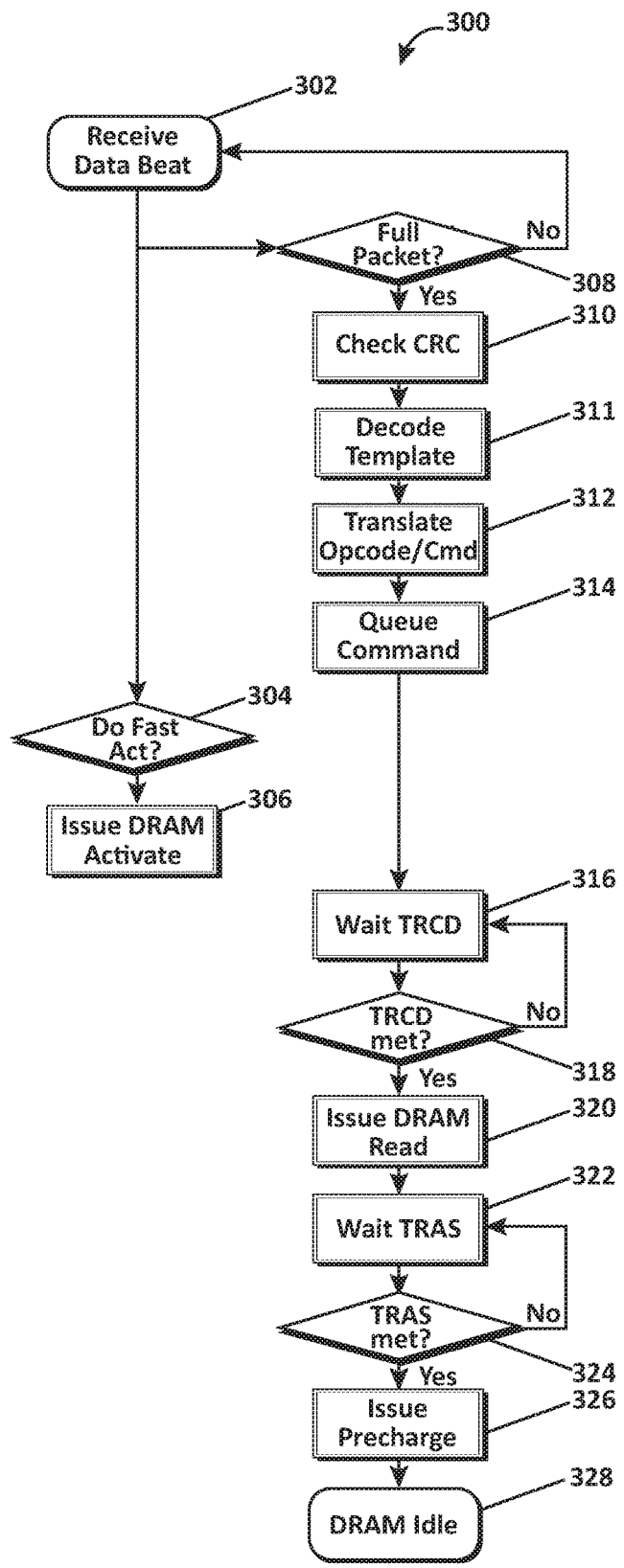
FIG. 3 is a flowchart of an embodiment of a method that may be performed by the system of FIG. 1 to execute an accelerated memory access operation using a speculative bank activate command.

FIG. 3 is a flowchart of an embodiment of a method 300 that may be performed by the system of FIG. 1 to execute an accelerated memory access operation using a speculative bank activate command. In the method 300, a speculative bank activate command for a new read command may be immediately issued at 306 to a memory before a full decode operation and error checking operation are accomplished.

In a speculative bank activate command operation, a data packet may arrive via a HSS PHY microchip in communication with a host at 302. A deserializer may take a number of cycles to receive the beat data via a serial bus.

Focusing first on a relatively slower feature of the method 300, the system at 308 may determine if the incoming data packet has been entirely received. If so at 308, the system at 30 may initiate CRC operations to check for errors. For instance, the CRC and decoder module 106 of FIG. 1 may verify that a read command is to be performed and may check the overall accuracy of the data. Should an error be found, the data may be discarded and made to be retransmitted.

At 311, the packet may be decoded among different templates or containers. As such, a speculative bank activate command may occur before a template or format of packet is entirely decoded. Translation and decoding operations may be performed at 312 on the received data packet. A determination may be made as to what type of command(s) are included in the data packet.

The relatively slower path of an embodiment of the method 300 may send retrieved commands to a queue, such as the DRAM reorder queue 108 of FIG. 1. While commands are queued, the method 300 may access timers to see if a needed resource is available. For instance, the system may determine that a resource is idle. If so, the system may issue a bank activate command via the DFI multiplexer and latch to the DDR interface. The bank activate command may pull in the row to be accessed. For a read command to be issued, the system may wait for the timing parameter, time row to column delay (tRCD) at 316 and 318.

A read command may also be queued in the DRAM reorder queue. Once the tRCD parameter is met, the read command may be sent down the same path at 320, but may actually go to memory to retrieve the data from memory. That is, the read command may initiate a retrieval of requested data to the host from the memory via the DDR interface.

After the read data has retrieved the data, the system may wait for another timing parameter, tRAS, at 322 corresponding to when a charge may be restored to the memory device. The tRAS timing parameter may indicate a minimum time until the system may wait after an activate until it may precharge. Once the timer indicates that tRAS has expired at 324, the memory banks may be eligible for a precharge command to be issued at 326.

A relatively faster path of an embodiment of the method 300 may concurrently use a fast activate path in parallel to receive the package data (e.g., data beat). The method 300 may not wait for the entire data beat to be received or decoded, as with the slower path. Instead, the system may issue a bank activate command, speculatively.

An intermediary process of a particular embodiment may determine if a speculative bank activate command is appropriate at 304. For example, the determination may be based on whether certain bits of the packet suggest a read command is present, or if a resource is idle. For instance, a bank activate command may not be issued if a bank is busy with a different access. In other example, the bank activate command may not be issued speculatively when the system is currently performing writes (i.e., not reads), or the device is not powered up. Other considerations may include disabled bits, or the device is undergoing a refresh, a throttling, or a calibration.

By not waiting for entire data packet to be received, time delays associated with waiting for the timing parameter tRCD in conventional serial processing may be reduced. An illustrative tRCD may still be twenty cycles after the bank activate command is speculatively issued. But by the time the read command is queued, tRCD will have counted down. Starting the tRCD timer earlier may reduce latency because the system would otherwise have had to wait for the entire tRCD to expire before the read command may be issued. That is, issuing the bank activate command speculatively may start the tRCD timer earlier to reduce waiting once the read command is ready.

Figure 4:
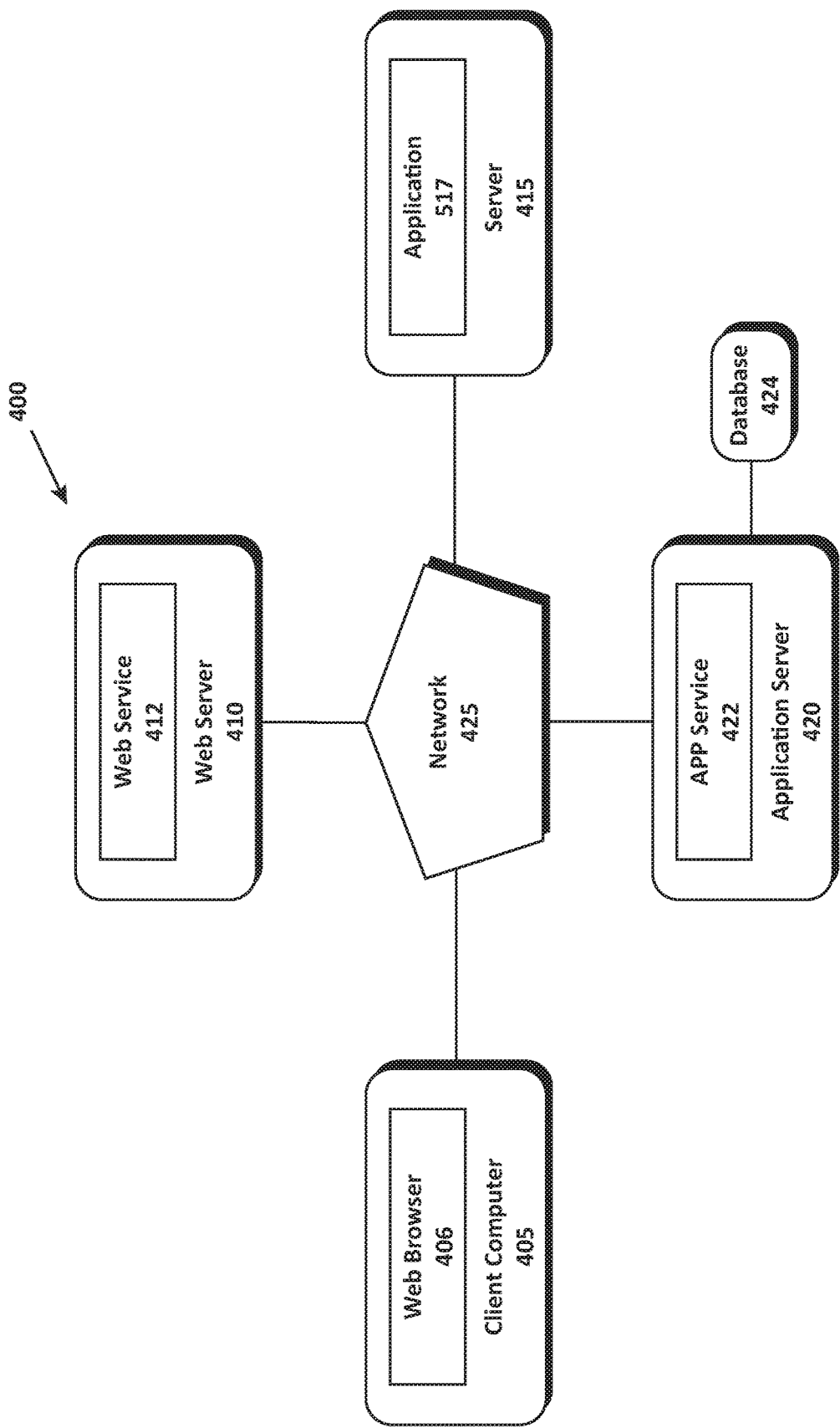
FIG. 4 illustrates an example computing system, according to one embodiment described herein.

FIG. 4 illustrates an example computing system, according to one embodiment described herein. As shown, the computing environment 400 includes a client computer 405, a web server 410, a server 415, and an application server 420. The client computer 405 may be a physical system (e.g., a POS system, a desktop computer, laptop computer, mobile device, etc.) or a virtual computing instance executing in the cloud. The client computer 405 includes a web browser 406. A user may access data services through the web browser 407 over a network 425 (e.g., the Internet).

For instance, a user may access a web service 412 executing on a web server 410 (e.g., a manufacturer website including driver software for a POS device). In one embodiment, the web service 412 provides a web interface for an application server 420 (e.g., executing an application service 422). More specifically, the application service 422 provides a database 424. The database 424 may include data presented to users on the web browser 407.

Figure 5:
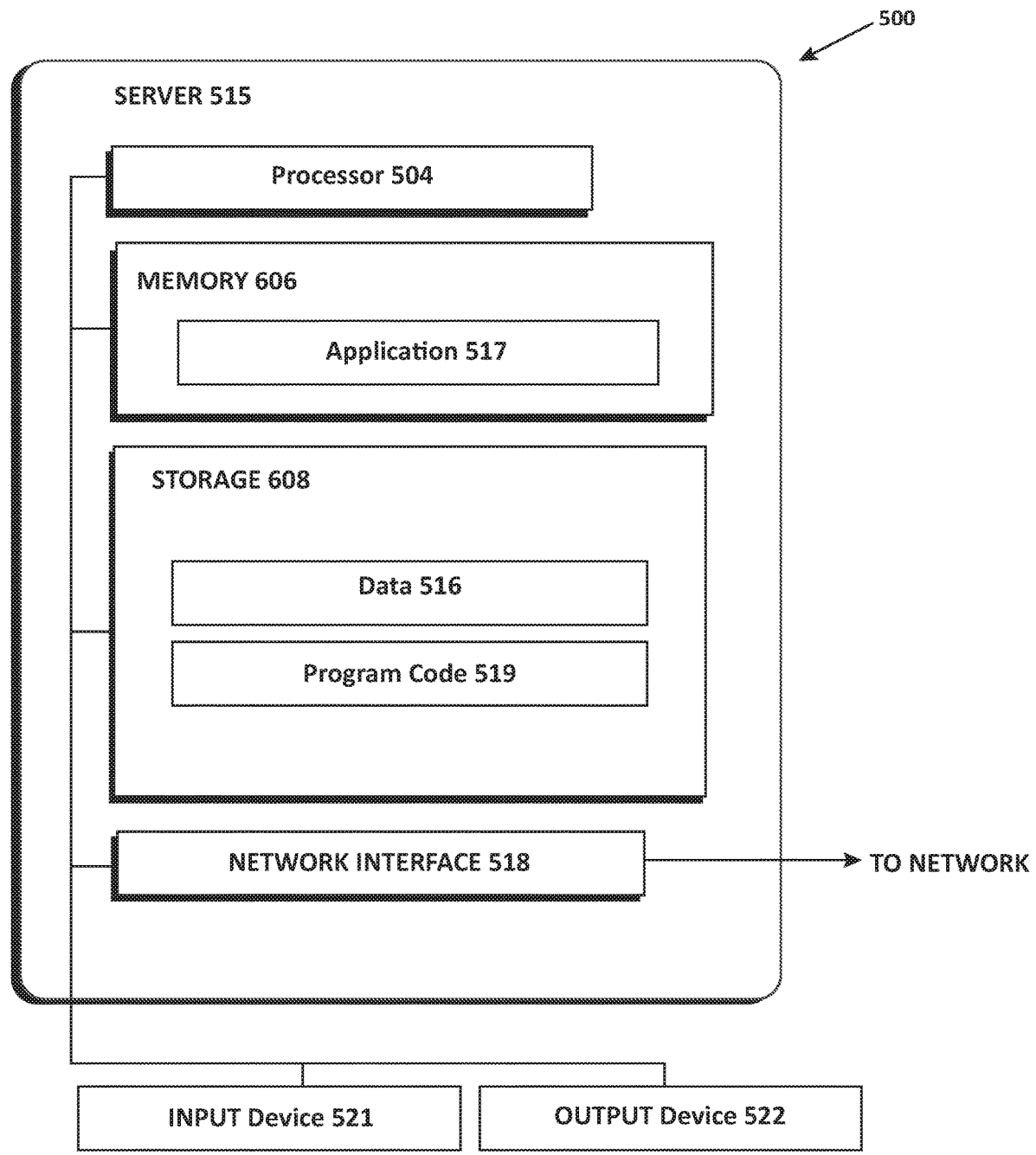
FIG. 5 further illustrates an example computing system, according to one embodiment described herein.

FIG. 5 further illustrates an example computing system 515, according to one embodiment described herein. The server 515 generally includes a processor 504 connected via a bus to a memory 506, a network interface device 518, a storage 508, an input device 521, and an output device 524. The server 515 is generally under the control of an operating system. Examples of operating systems include the UNIX operating system, versions of the Microsoft Windows operating system, and distributions of the Linux operating system (UNIX is a registered trademark of The Open Group in the United States and other countries. Microsoft and Windows are trademarks of Microsoft Corporation in the United States, other countries, or both. Linux is a registered trademark of Linus Torvalds in the United States, other countries, or both). More generally, any operating system supporting the functions disclosed herein may be used. The processor 504 is included to be representative of a single CPU, multiple CPUs, a single CPU having multiple processing cores, and the like. Similarly, the memory 506 may be a random access memory. While the memory 506 is shown as a single identity, it should be understood that the memory 506 may comprise a plurality of modules, and that the memory 506 may exist at multiple levels, from high speed registers and caches to lower speed but larger DRAM chips. The network interface device 518 may be any type of network communications device allowing the navigation server 510 to communicate with other computers via the network 525, including a wired or wireless network interface.

The storage 508 may be a persistent storage device. Although the storage 508 is shown as a single unit, the storage 508 may be a combination of fixed and/or removable storage devices, such as fixed disc drives, solid state drives, removable memory cards, optical storage and network storage systems. Further, the storage 508 may include a suitable electronic database.

As shown, the memory 506 contains the application 517, which may be an application generally executed to take actions described herein (e.g., as discussed above with regard to FIGS. 1-4. Storage 508 contains data 516 and program code 519.

The input device 521 may provide a keyboard and a mouse, etc. The output device 522 may be any conventional display screen. Although shown separately from the input device 521, the output device 524 and input device 521 may be combined. For example, a display screen with an integrated touch-screen may be used.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the preceding, reference is made to embodiments presented in this disclosure. However, the scope of the present disclosure is not limited to specific described embodiments. Instead, any combination of the preceding features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present invention may take the form of an entirely hardware embodiment, an entirely software embodiment (including firmware, resident software, microcode, etc.) or an embodiment combining software and hardware aspects that The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Embodiments of the invention may be provided to end users through a cloud computing infrastructure. Cloud computing generally refers to the provision of scalable computing resources as a service over a network. More formally, cloud computing may be defined as a computing capability that provides an abstraction between the computing resource and its underlying technical architecture (e.g., servers, storage, networks), enabling convenient, on-demand network access to a shared pool of configurable computing resources that can be rapidly provisioned and released with minimal management effort or service provider interaction. Thus, cloud computing allows a user to access virtual computing resources (e.g., storage, data, applications, and even complete virtualized computing systems) in "the cloud," without regard for the underlying physical systems (or locations of those systems) used to provide the computing resources.

Typically, cloud computing resources are provided to a user on a pay-per-use basis, where users are charged only for the computing resources actually used (e.g. an amount of storage space consumed by a user or a number of virtualized systems instantiated by the user). A user can access any of the resources that reside in the cloud at any time, and from anywhere across the Internet.

While the foregoing is directed to embodiments of the present invention, other and further embodiments of the invention may be devised without departing from the basic scope thereof, and the scope thereof is determined by the claims that follow.

What is claimed is:

1. A method of performing a memory access operation, the method comprising:
   initiating decoding of a portion of a command in a data packet;
   automatically speculating as to a type of the command based on the portion of the command; and
   based on the speculation as to the type of the command, initiating generation of a bank activate command before the data packet is entirely decoded.

2. The method of claim 1, wherein the type of the command is of a plurality of types of commands.

3. The method of claim 1, further comprising determining whether a resource is available prior to generating the bank active command.

4. The method of claim 1, wherein the speculating includes speculating the type of the command based on an assumption that applies to all arriving packets.

5. The method of claim 1, further comprising sending the command to a scheduling queue.

6. The method of claim 1, further comprising abandoning the bank activate command.

7. The method of claim 1, further comprising sending the command to both a scheduling queue and a first in, first out (FIFO) queue.

8. The method of claim 1, wherein the bank activate command is generated before the data packet is error checked.

9. The method of claim 1, wherein the bank activate command is generated before the data packet is entirely decoded.

10. A system, comprising:
   a decoder configured to initiate decoding of a portion of the command in a data packet; and
   a processor configured to automatically speculate as to the type of the command based on the portion of the command, and based on the speculation as to the type of the command, to initiate generation of a bank activate command before the data packet is entirely decoded.

11. The system of claim 10, wherein the type of the command is of a plurality of types of commands.

12. The system of claim 10, wherein the processor is configured to determine whether a resource is available prior to generating the bank active command.

13. The system of claim 10, wherein the bank activate command is generated before a template of the data packet is fully decoded.

14. The system of claim 10, wherein the bank activate command is abandoned before a read command is issued for a resource.

15. The system of claim 10, wherein the command is sent to both a scheduling queue and a first in, first out (FIFO) queue.

16. The system of claim 10, wherein the bank activate command is generated before the data packet is error checked.

17. The system of claim 10, wherein the bank activate command is generated before the data packet is entirely decoded.

18. A computer program product for performing a memory access operation, the computer program product comprising:
   a computer-readable storage medium having computer-readable program code embodied therewith, the computer-readable program code executable by one or more computer processors to:
      initiate decoding of a portion of a command in a data packet;
      automatically speculate as to the type of the command based on the portion of the command; and
      based on the speculation as to the type of the command, generate a bank activate command before the data packet is entirely decoded.

19. The computer program product of claim 16, wherein the bank activate command is generated before the data packet is error checked and before the data packet is entirely received.

20. The computer program product of claim 16, wherein the type of the command is of a plurality of types of commands.

* * * * *